United States Patent [19]

Loscher

[11] Patent Number: 4,700,359
[45] Date of Patent: Oct. 13, 1987

[54] CIRCUIT ARRANGEMENT FOR SAMPLING A TERNARY SIGNAL

[75] Inventor: Jürgen Loscher, Nuremberg, Fed. Rep. of Germany

[73] Assignee: U.S. Philips Corporation, New York, N.Y.

[21] Appl. No.: 870,272

[22] Filed: Jun. 3, 1986

[30] Foreign Application Priority Data

Jun. 4, 1985 [DE] Fed. Rep. of Germany ....... 3519929

[51] Int. Cl.[4] ............................................. H04L 25/34
[52] U.S. Cl. ..................................... 375/20; 375/118; 328/151
[58] Field of Search .................... 375/17, 20, 118, 120, 375/95; 328/150, 151; 377/43, 54, 39; 328/72; 307/510

[56] References Cited

U.S. PATENT DOCUMENTS 3,864,529  2/1975  Tracey et al. ....................... 328/151
4,339,823  7/1982  Predina et al. ...................... 375/120

Primary Examiner—Benedict V. Safourek
Assistant Examiner—Andrew J. Telesz, Jr.
Attorney, Agent, or Firm—Marianne R. Rich; Anne E. Barschall

[57] ABSTRACT

In a circuit arrangement for sampling a ternary signal, this ternary signal is divided by amplitude decision circuits into two binary signals and the binary sub-signals are sampled at m-times the rate of the symbol clock. The binary samples of each sub-signal are shifted through a shift register having at least m stages and intermediately stored in a buffer store for one period of the symbol clock. With the aid of a logic circuit it is then determined in which regions of the buffer store accumulations of identical binary values occur. Regions in which the accumulations always re-occur—the number of occurrences is checked by means of counters—are considered to be eyes of the ternary signal. In each clock period of the synbol clock, a sample falling within the eye of the ternary signal is transferred from each buffer store at an output of the circuit with the aid of a gate circuit.

9 Claims, 3 Drawing Figures

CIRCUIT ARRANGEMENT FOR SAMPLING A TERNARY SIGNAL

FIELD OF THE INVENTION

The invention relates to a circuit arrangement for sampling a ternary signal, in which the ternary signal is applied to the inputs of two window comparators and its largest amplitudes fall within the window of the first comparator and its smallest amplitudes in the window of the second window comparator.

A circuit arrangement of this type can, for example, be used in regenerators, with which AMI-encoded line signals are to be regenerated.

DESCRIPTION OF THE PRIOR ART

German Pat. No. DE-C2-2,827,958 discloses a regenerator in which, to recover a n-ary signal having n amplitude levels, n-1 amplitude decision circuits (window comparators) are used whose superposed output signals provide the regenerated n-ary signal.

Before the n-ary signal is applied to the amplitude decision circuits, it passes through a sampling stage clocked at the symbol rate of n-ary signal so that signal portions are extracted at desired sampling instants—namely in the center of the eye.

However, the above-cited publication does not describe how the phase position of the symbol clock can be influenced to ensure that sampling is indeed effected approximately in the centre of the eye, so optimally. Difficulties occur more specifically when the eye opening of a useful signal to be regenerated can change during the transmission, so that an optimum sampling must be effected at instants which are not previously predeterminable. Such a change in the eye opening occurs, for example, at the S-interface (CCITT-Recommendation I.430, Section 3) of the future integrated services digital telecommunication network (ISDN). In this case the useful signal is a multiplex signal which is assembled from the signals of the subscriber's terminals whose activities are synchronised by a network termination circuit. When a subscriber's terminal starts to transmit, whilst another terminal does already transmit its send signal, then a decrease in the eye opening occurs in the overall signal, this decrease depending on the respective signal propagation delays between the subscriber's terminal and the network termination circuit.

SUMMARY OF THE INVENTION

The invention has for its object to provide a sampling circuit of the type defined in the opening paragraph which continuously determines the optimum sampling phase position from the ternary useful signal.

In a circuit arrangement of the type defined in the opening paragraph, this object is accomplished in that the output signal of each window comparator is sampled by a clock signal having a rate of m-times the symbol clock rate and having a fixed phase relationship to the symbol clock of the ternary signal;

that the respective binary samples are shifted through a shift register having at least m stages and the contents of the respective shift registers are transferred at the symbol clock rate to respective buffer stores;

that the outputs of the two buffer stores are connected to the inputs of a logic circuit and an output of the logic circuit is assigned to each group of k consecutive memory locations of the first buffer store and the corresponding group of the second buffer store;

that a binary one is present at this output when one of said two groups of memory locations contains only binary ones;

that each binary one at an output of the logic circuit increments a counter assigned to this output;

that reaching a first predetermined position of any one of these counters is then transferred as a binary one to the memory locations of a third buffer store when one of the counters has reached a second, but higher predetermined position and that then all the counters are reset;

that all the memory locations of the third buffer store are connected to the inputs of a selection circuit which conveys only one of the ones present at its inputs to the associated output;

that by means of the signals at the output of the selection circuit a gate circuit is rendered conductive for one of the binary samples stored in the first buffer store and for one of the samples stored in the second buffer store.

The arrangement according to the invention is distinguished by that it is only assembled from digital modules and consequently can be implemented without any further measures as an integrated circuit.

Advantageous embodiments and further developments of the invention can be taken from the sub-claims.

BRIEF DESCRIPTION OF THE DRAWINGS

An exemplary embodiment of the invention will now be described in greater detail with reference to the accompanying Figures, in which.

DESCRIPTION OF THE PREFERRED EMBODIMENTS

Figure 1:
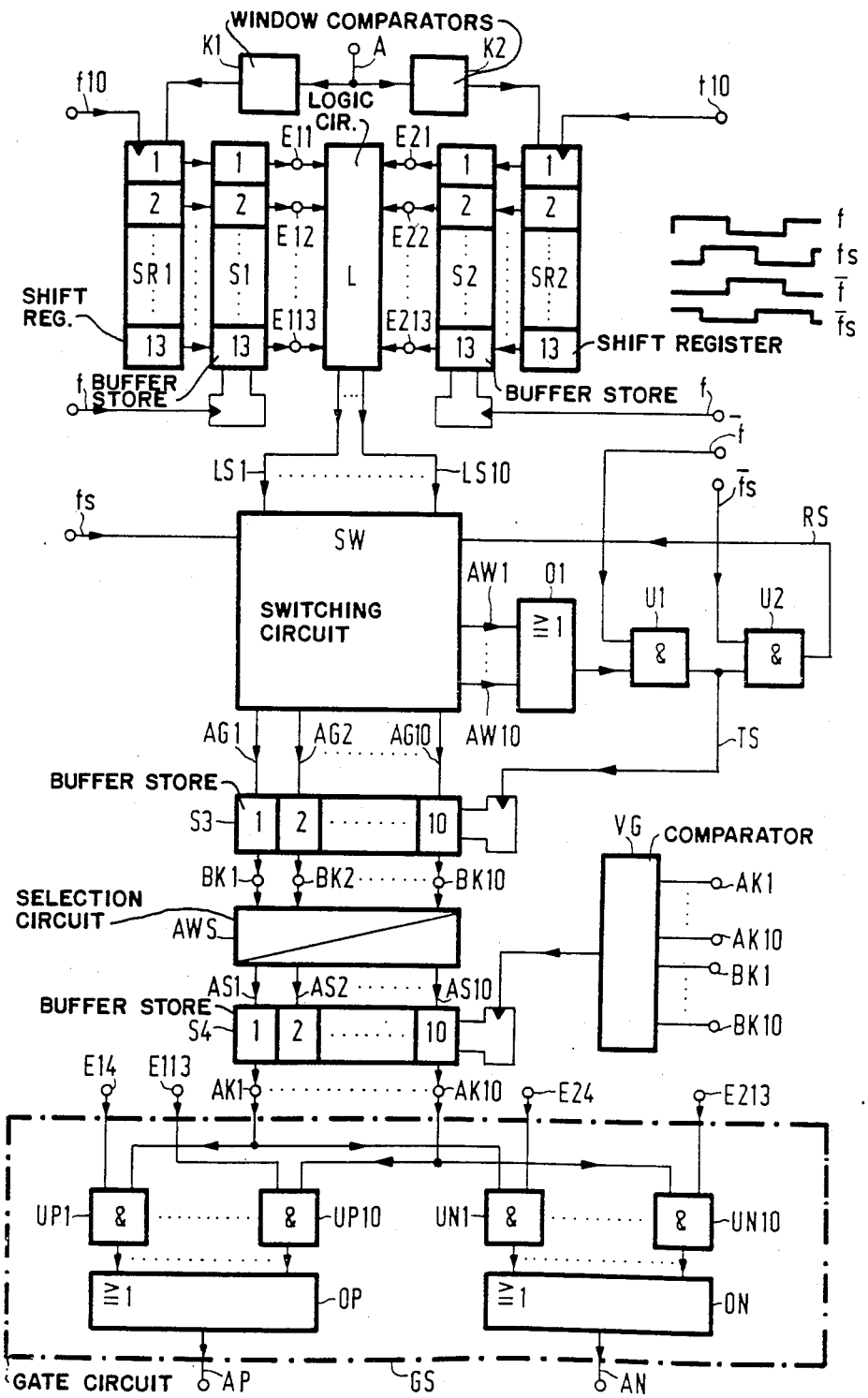
FIG. 1 shows a blook diagram of an embodiment according to the invention.

As is shown in FIG. 1, the ternary signal to be regenerated—in the embodiment a pseudo-ternary AMI encoded signal A—is applied to two window comparators K1 and K2. The positive pulses of the signals A fall within the window of the comparator K1 and the negative pulses fall within the window of the comparator K2. Thus, at the occurrence of a positive pulse a binary one is present at the output of the comparator K1, whilst the output of the comparator K2 then assumes a potential corresponding to a binary zero.

Alternative embodiments are conceivable in which these binary values and the binary values mentioned in the further course of the description are replaced by their complements. The selected mode of fixing the binary values is however of no importance for the invention and is only used for the sake of simplicity.

The binary values at the outputs of the comparators K1 and K2 are sampled by a clock signal f10, whose clock rate is ten times the rate of the symbol clock f associated with the signal A; consequently m=10 is chosen for the present example. For each comparator, a shift register SR1, SR2 is provided through which the binary samples are shifted at a rate f10 and these samples are transferred in parallel at the rate f to a buffer store S1, S2. The phase relationship of the symbol clock f relative to the signal A may be arbitrary; consequently it is not required for the clock f to be recovered from the signal A. Any appropriate clock source having the nominal frequency of the symbol clock associated with the signal A is sufficient. The clocks f10 have a time-independent phase relationship to each other.

The number of stages of the shift register SR1, SR2, said number being equal to the number of binary memory cells in the buffer stores S1 and S2, has been chosen so high—namely 13—that, irrespective of the phase position of the clock f, always 10 groups of four consecutive samples each—thus k was chosen equal to four in the present example—can be accommodated therein. In this way it is ensured that at each clock pulse of the clock f all the signal element samples falling within the eye of the signal A are contained as a contiguous sequence in the buffer store S1 or S2. In addition, it is assumed that at least four samples of each signal element fall within the eye of the signal A, so that the eye width is at least 2/5 of the nominal period of the symbol clock f.

The further circuit portions have for their object inter alia to automatically determine the location of the eye of the ternary signal A within the signal sections stored in the buffer stores S1 and S2 and to convey one of the samples associated with the eye from the buffer store S1 to the output AP or from the buffer store S2 to the output AN at each olock pulse edge of the symbol clock f.

To determine the position of the eye, the binary ones in the buffer stores S1 and S2 are used. If, at the clock edges of the clock f, binary ones occur frequently at the same four consecutive memory cells of the buffer store S1 or S2, then these positions are considered to be the eye's center of the signal A. The possible positions of the eye's center is determined by the logic circuit L, to which the buffer store S1 is connected via the terminals E11 to E113 and the buffer store S2 via the terminals E21 to E213, respectively.

Figure 2:
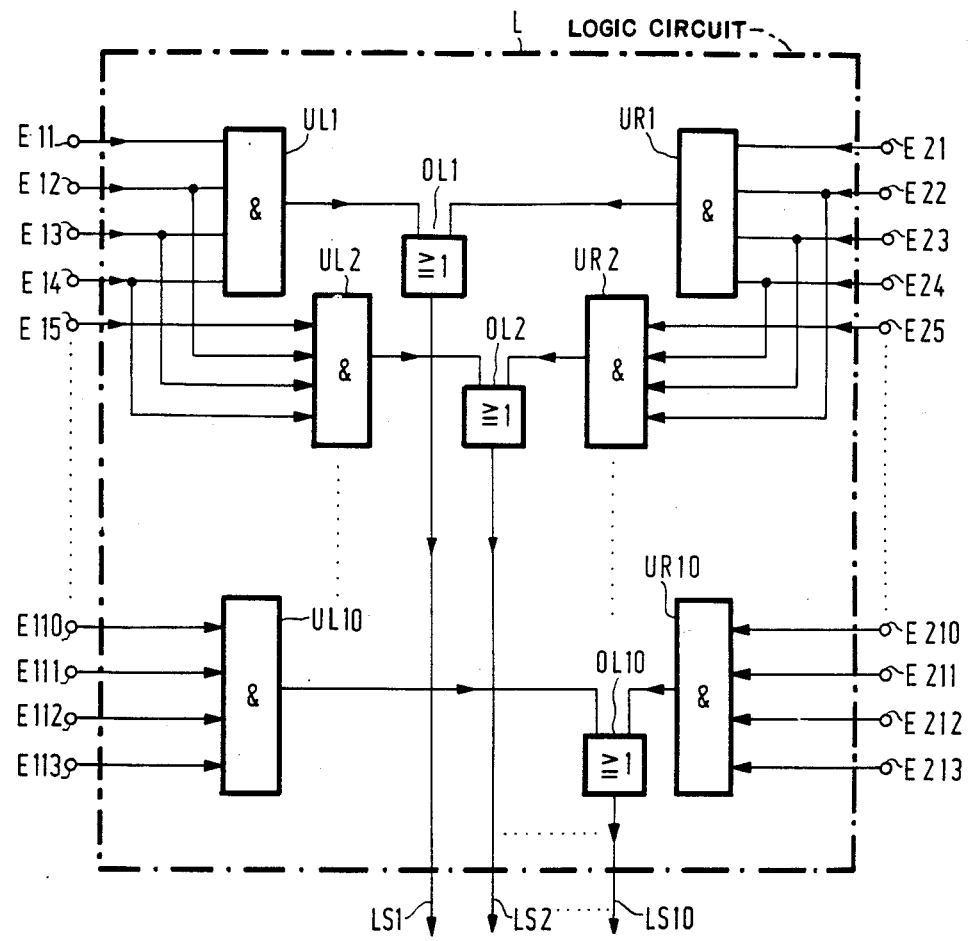
FIG. 2 and FIG. 3 show the inner structure of functional blocks of the embodiment of FIG. 1.

FIG. 2 shows the precise structure of the logic circuit L. The first four memory cells of the buffer store S1 are connected to the four inputs of a first AND-gate UL1 via the terminals E11 to E14. The memory cells 2 to 5 of the buffer store S1 are connected via the terminals E12 to E15 to the inputs of a second AND-gate UL2, and so forth until the memory cells 10 to 13, which are connected to the inputs of a tenth AND-gate UL10 via the terminals E110 to E113. The same applies to the connection of the memory cells of the buffer store S2 to the AND-gates UR1 to UR10 via the terminals E21 to E213.

Figure 3:
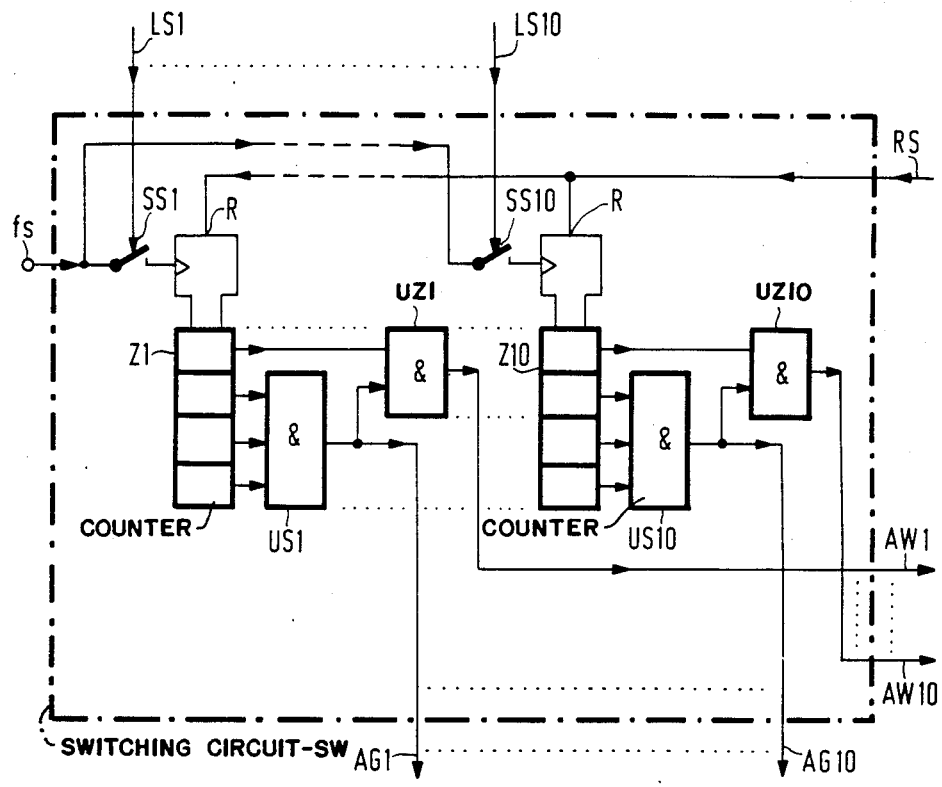

The outputs of the AND-gates UL1 and UR1, which form a gate pair, are applied to an OR-gate OL1. A binary one is produced at the output of this OR-gate OL1 when only binary ones are contained in the first four memory cells of the buffer store S1 or in the first four memory cells of the buffer store S2. Also here, the same applies to the pairs of AND-gates UL2, UR2 to UL10, UR10 and the OR-gates OL2 to OL10. The outputs of the OR-gates OL1 to OL10 also constitute the outputs of the logic circuit L; they are connected to the inputs of a switching circuit SW via the lines LS1 to LS10 and with the aid of this circuit SW it is counted how often binary ones occur at the outputs of the OR-gates OL1 to OL10. For this purpose—FIG. 3 shows details of the switching circuit SW—10 counters Z1 to Z10 are provided, each individual counter being associated with a respective one of the OR-gates OL1 to OL10. If at a clock instant of the clock f a binary one is produced at the output of one of the OR-gates, then the associated counter is incremented by one count unit.

Switches SS1 to SS10, whose control inputs are respectively connected to the lines LS1 to LS10, are provided for incrementing the counters Z1 to Z10. A binary one on one of these lines closes the associated switch, a clock pulse of the clock signal fs then being applied via this switch to the counting input of the connected counter. The clock signal fs is the symbol clock f whose phase is shifted through 90°; the phase shift is necessary to prevent signal time delays from resulting in functional errors. The phase relationship between all the clock signals used in the embodiment is shown schematically in the right hand top part of the FIG. 1.

Each one of the 4-stage counters Z1 to Z10 of the switching circuit SW is provided with an interrogation circuit formed by two AND-gates. By means of the first AND-gates US1 to US10 a logic AND combination of the three most significant stages of each one of the counters Z1 to Z10 is effected. A binary one appears at the output of the AND-gates US1 to US10 when the connected counter has reached a counting position of at least 14. These binary ones are applied via lines AG1 to AG10 to the inputs of a third buffer store S3 having ten memory locations.

A binary one occurs at the output of the second AND-gates UZ1 to UZ10 of each interrogation circuit as long as the connected counter is in its highest counting position, i.e. 15.

The outputs of the second AND-gates UZ1 to UZ10 are connected via lines AW1 to AW10 to a ten-input OR-gate 01 at whose output a binary one is consequently produced when at least one of the counters Z1 to Z10 has reached its highest position.

For forming clock pulses, the output signal of the OR-gate 01 is combined with the inverted symbol clock f̄ by means of an AND-gate U1, whose output signal is used for clocking the buffer store S3, to which the binary values on the lines AG1 to AG10 are transferred. After a clock pulse has been produced on a line TS, a binary one in the memory cells of the buffer store S3 indicates which one of the counters Z1 to Z10 has arrived in the position 14 or 15. If this occurs, for example, for counter Z10, then this implies that the last four memory cells of the buffer store S1 or the last four memory cells of the buffer store S2 contained only binary ones at 14 or 15 clock pulses of the symbol clock f. Consequently, the signal sections which were intermediately stored in the last four memory cells of the buffer stores S1 and S2 belong to the eye's center of the signal A and the sample stored in the memory cell 13 of the buffer store S1 is applied to the output AP and the sample stored in memory cell 13 of the buffer store S2 is applied to the output AN of the circuit shown in FIG. 1.

To provide the possibility to effect this procedure, the buffer store S3 is followed by a selection circuit AWS whose inputs are connected to the outputs of the cells 1 to 10 of the buffer store S3 via terminals BK1 to BK10. An output is assigned to each input of the selection circuit AWS. If a binary one is present at several inputs of the selection circuit AWS, then this binary one is only conveyed to the associated output of one input, whilst a binary zero is present at all the other outputs. The binary values at the outputs of the selection circuit are applied via lines AS1 to AS10 to the memory cells 1 to 10 of a fourth clocked buffer store S4, whose function will be described in greater detail hereinafter.

If now a binary one is stored in, say, the tenth memory cell of the buffer store S4—all the other memory cells then contain binary zeroes—the AND-gates UP10 and UN10 of a gate circuit connected to the buffer store S4 are rendered conductive. For gate UP10, whose second input is connected to the terminal E113, the information stored in the thirteenth memory cell of the buffer store S1 is applied to the gate output and via an OR-gate OP to the output AP. For the gate UN10, whose second input is connected to the terminal E213, the information stored in the thirteenth memory cell of the buffer store S2 is applied to the gate output and via an OR-gate ON to the output AN.

If a memory cell other than the tenth cell of the buffer store S4 contains the binary one, a different one of the AND-gates UP1 to UP10 or UN1 to UN10, respectively of the gate circuit GS is rendered conductive, and the stored binary values of other memory cells of the buffer store S1 and S2 are conveyed to the outputs AP and AN for further processing.

When with the aid of the switching circuit SW and its counters Z1 to Z10, the position of the eye has been found, then the search is repeated, whilst all the counters are reset to zero as soon as a counter has reached its highest position. The reset-to-zero pulse for the counters is recovered from the output signal of the AND-gate U1 and a clock $\overline{fs}$, whose phase is shifted through 270° relative to the symbol clock f. Both signals are applied to a further AND-gate U2, whose output is connected via a line RS to the reset inputs R of all the counters Z1 to Z10.

As was described already in the foregoing, the content of the buffer store S4 determines the memory cells of the intermediate stores S1 and S2 whose binary values are conveyed to the outputs AP and AN; it consequently determines the sampling phase position of the signal A. If, for example, the width of the eye of the signal A increases in the course of time, then the sampling phase position selected before the increase of the eye's width is as suitable for use as, for example, a new sampling phase position, which would only result from the mode of operation of the selection circuit AWS. So as to avoid unnecessary sudden transients in the sampling phase position, a 20-input comparator VG is provided connected to the terminals AK1 to AK10 and BK1 to BK10. Then the comparator VG only applies a clock pulse to the buffer store S4 when the sampling phase position before a change in the eye's width is not contained in the permissible sampling phase position after a change in the eye's width, that is to say when none of the logic AND combinations between the two signals at the terminals AK1 and BK1 to AK10 and BK10 assume the value one. Only in this case the binary values present at the output of the selection circuit AWS are transferred by means of the clock pulse of the comparator VG to the buffer store S4, the memory cell in which the sole binary one is stored determining the new sampling phase position.

What is claimed is:

1. In a circuit arrangement for sampling a ternary signal, including means for applying the ternary signal to the inputs of first and second window comparators, such that the largest amplitudes of the ternary signal fall within a window of the first window comparator and its smallest amplitudes within a window of the second window comparator, the improvement comprising:
   (a) first and second shift registers (SR1, SR2) for sampling an output signal of the first and second window comparators, respectively (K1, K2) under control of a clock signal (f10) having a rate of m times the symbol clock rate of the ternary signal and having a fixed phase relationship to the symbol clock of the ternary signal, the respective shift registers each having at least m stages for receiving and shifting respective binary samples;
   (b) first and second respective buffer stores (S1, S2) into which the binary samples from the respective shift registers (SR1, SR2) are transferred at the symbol clock rate of the ternary signal (f);
   (c) a logic circuit (L) having respective inputs connected to respective outputs of the first and second buffer stores and respective outputs (LS1 ... LS10) which are assigned to each group of k consecutive memory locations of the first buffer store (S1) and a corresponding second group of k consecutive memory locations of the second buffer store (S2), a binary one being present at one of said outputs (LS1 ... LS10) of the logic circuit when one of said two groups of k consecutive memory locations contains only binary ones;
   (d) a plurality of counters (Z1 ... Z10) each assigned to one of said output (LS1 ... LS10) of the logic circuit (L), each binary one at an output of the logic circuit (L) incrementing the counter (Z1 ... Z10) assigned to this output;
   (e) a third buffer store (S3) coupled to receive at respective memory locations a binary one representing a first predetermined position of any one of the counters (Z1 ... Z10), when one of the counters (Z1 ... Z10) has reached a second, but higher predetermined position, all the counters (Z1 ... Z10) then being reset;
   (f) a selection circuit (AWS) having inputs connected to all the memory locations of the third buffer store (S3), the selection circuit conveying one of the binary ones present at its inputs to an associated selection circuit output; and
   (g) a gate circuit (GS) which is rendered conductive, by means of the binary signals at the output of the selection circuit, for one of the binary samples stored in the first buffer store (S1) and for one of the binary samples stored in the second buffer store (S2).

2. An arrangement as claimed in claim 1, characterized in that a fourth clocked buffer store (S4) clocked by a comparator (VG) is arranged between the selection circuit (AWS) and the gate circuit (GS), and that the comparator (VG) produces a clock pulse only when the binary values at the outputs of the third buffer store (S3) do not correspond in any location to the binary values at the corresponding outputs of the fourth buffer store (S4).

3. An arrangement as claimed in claim 1 characterized in that m has the value 10, the shift registers (SR1, SR2) each have 13 stages and that the first and second buffer stores (S1, S2) likewise comprise 13 memory locations.

4. An arrangement as claimed in claim 3, characterized in that k has the value 4, and the logic circuit (L) comprises ten pairs of AND-gates (UL1, UR1, ... UL10, UR10) with each AND-gate having four inputs, the four inputs of the first AND-gates (UL1 ... UL10) of a pair are connected to four consecutive outputs of the first buffer store (S1), the four inputs of the second AND-gates of a pair (UR1, ... UR10) to corresponding outputs of the second buffer store (S2) and that the outputs of each pair of AND-gates are combined via a respective OR-gate (OL1 . . . OL10), whose respective outputs constitute outputs (LS1 . . . LS10) of the logic circuit.

5. An arrangement as claimed in claim 4, characterized in that all the counters (Z1 . . . Z10) are identical and the first predetermined position is the highest position of each counter reduced by one count unit.

6. An arrangement as claimed in claim 5, characterized in that all counters (Z1 . . . Z10) are 4-stage counters.

7. An arrangement as claimed in claim 6, comprising means for clocking the third buffer store (S3) including:
- a plurality of logic AND-combinations (US1, UZ1 . . . US10, UZ10) of the output of all the stages of each of the respective counters;
- a first OR-gate (O1), having respective inputs coupled to the logic AND-combinations;
- a first AND-gate (U1) having two inputs one of the inputs of the first AND-gate (U1) being coupled to the output of the first OR-gate (O1), the other input of the first AND-gate (U1) being coupled to receive the inverted symbol clock of the ternary signal ($\bar{f}$) and the output of the first AND-gate (U1) being connected to the clock input of the third buffer store (S3).

8. A circuit arrangement as claimed in claim 7, characterized in that for resetting to zero all the counters (Z1 . . . Z10) the output of the first AND-gate (U1) is applied to an input of a second AND-gate (U2) having two inputs, the other input of the second AND-gate (U2) receives the symbol clock of the ternary signal ($\bar{fs}$) shifted through 270° and that the output of the second AND-gate (U2) is applied to the reset inputs (R) of the counters (Z1 . . . Z10).

9. A circuit arrangement as claimed in claim 2, characterized in that the gate circuit (GS) comprises two sections each having ten AND-gates (UP1 . . . UP10, UN1 . . . UN10) having first and second inputs, each first input of an AND-gate (UP1 . . . UP10) of the first section being connected to a respective output (E14 . . . E113) of ten consecutive memory locations of the first buffer store (S1), each first input of an AND-gate (UN1 . . . UN10) of the second section being connected to a respective output (E24 . . . E213) of ten consecutive memory locations of the second buffer store (S2), the second inputs of the AND-gates of the first and second sections being each connected to respective outputs of the fourth buffer store (S4), the outputs of the AND-gates (UP1 . . . UP10) of the first section being connected to the inputs of a first OR-gate (OP) having ten inputs and the outputs of the AND-gates (UN1 . . . UN10) of the second section being connected to the inputs of a second OR-gate (ON) having ten inputs.

* * * * *